(12) United States Patent
Stejskal et al.

(10) Patent No.: US 6,918,121 B2
(45) Date of Patent: Jul. 12, 2005

(54) PROVIDING ACCESS TO APPLICATION DATA ITEMS OF AN APPLICATION PROGRAM

(75) Inventors: Jirka Stejskal, Decin (CZ); Tomas Rokos, Decin (CZ)

(73) Assignee: Autodesk, Inc., San Rafael, CA (US)

( * ) Notice: Subject to any disclaimer, the term of this patent is extended or adjusted under 35 U.S.C. 154(b) by 665 days.

(21) Appl. No.: 09/876,285

(22) Filed: Jun. 7, 2001

(65) Prior Publication Data

US 2001/0056436 A1 Dec. 27, 2001

(30) Foreign Application Priority Data

Jun. 26, 2000 (DE) .......................................... 100 31 041

(51) Int. Cl.$^7$ ................................................ G06F 9/54
(52) U.S. Cl. ............... 719/315; 707/103 R; 707/103 Z; 707/1; 707/3
(58) Field of Search ................................ 719/315, 316, 719/310, 328; 707/100–104.1, 1–10

(56) References Cited

U.S. PATENT DOCUMENTS

| | | | |
|---|---|---|---|
| 5,121,333 A | | 6/1992 | Riley et al. |
| 5,421,015 A | * | 5/1995 | Khoyi et al. ................. 718/107 |
| 5,608,909 A | * | 3/1997 | Atkinson et al. ........... 719/315 |
| 5,634,124 A | * | 5/1997 | Khoyi et al. ............ 707/103 R |
| 5,652,880 A | * | 7/1997 | Seagraves ................ 707/103 R |
| 5,680,618 A | * | 10/1997 | Freund ........................... 707/7 |
| 5,682,532 A | * | 10/1997 | Remington et al. ......... 719/316 |
| 5,689,711 A | * | 11/1997 | Bardasz et al. ............. 717/105 |
| 5,696,961 A | * | 12/1997 | Briscoe et al. .................. 707/2 |
| 5,761,674 A | * | 6/1998 | Ito ........................... 707/104.1 |
| 5,899,996 A | * | 5/1999 | Dysart et al. ........... 707/103 R |
| 6,052,691 A | * | 4/2000 | Ardoin et al. ............... 707/102 |
| 6,223,227 B1 | * | 4/2001 | Williamson et al. ........ 719/315 |
| 6,263,341 B1 | * | 7/2001 | Smiley ................... 707/103 R |
| 6,301,581 B1 | * | 10/2001 | Smiley ................... 707/103 R |
| 6,535,874 B2 | * | 3/2003 | Purcell ........................... 707/3 |
| 6,622,149 B1 | * | 9/2003 | Kellstrom, Jr. ........... 707/104.1 |
| 6,728,726 B1 | * | 4/2004 | Bernstein et al. ........... 707/204 |
| 6,738,789 B2 | * | 5/2004 | Multer et al. ................ 707/201 |
| 6,792,607 B1 | * | 9/2004 | Burd et al. .................. 719/316 |
| 6,826,759 B2 | * | 11/2004 | Calder et al. ............... 719/328 |
| 6,832,215 B2 | * | 12/2004 | Gauthier et al. ................ 707/1 |

OTHER PUBLICATIONS

Gregory McFarland et al., "Object–Oriented Database Management Systems Revisited," (Modus Operandi, Inc.), DoD Data & Analysis Center for Software (DACS), Rome, NY, Jan. 1999, (table of contents, Abstract, pp. 13–34).

(Continued)

*Primary Examiner*—Lewis A. Bullock, Jr.
(74) *Attorney, Agent, or Firm*—Gates & Cooper LLP (57) ABSTRACT

A method for providing access to application data items of an application program, said application data items being contained in a plurality of interconnected data objects processed by said application program, comprises the steps of receiving a request related to at least one of said application data items, said request referring to a data object of said plurality of data objects, fulfilling said request with respect to said data object referred to by said request, and if said request concerns at least one other data object of said plurality of data objects, forwarding said request to said at least one other data object for further processing of said request. A computer program product and an apparatus comprise corresponding features. The invention provides a way of accessing application data items that is very flexible and can in particular be used with complex application data structures comprising a plurality of interconnected data objects.

19 Claims, 5 Drawing Sheets

OTHER PUBLICATIONS

CADint PCB User Manual, CADint Sweden, Feb. 1998, (table of contents, chapter "Propagating Select across database structure," pp. 59–62).

Suresh K. Bhavnani et al., "Delegation and Circumvention: Two Faces of Efficiency," Conference Proceedings on Human Factors in Computer Systems, Los Angeles, California 1998, pp. 273–280.

Vitaly Semenov et al., "An Object–Oriented Architecture for Integrated CAD Systems," Proceedings of CAD 2000, Berlin, Mar. 2000, pp. 195–217.

Autodesk—AutoCAD: ObjectARX Proxy Objects, web site pp. 1–7, 1997.

Autodesk—AutoCAD: Object Technology Inside AutoCAD, web site pp. 1–11, 1997.

* cited by examiner

PROVIDING ACCESS TO APPLICATION DATA ITEMS OF AN APPLICATION PROGRAM

FIELD OF THE INVENTION

The invention concerns the field of application programs, and in particular the field of providing access to data processed by an application program. The invention can be used for all kinds of application programs, especially for programs that handle complex data that is stored internally in a plurality of interconnected data objects. Such programs may be graphical editing and design programs, document and text processing programs, planning and scheduling programs and so on. In particular, use of the invention is proposed for computer aided design (CAD) programs such as the products available under the trademark "AutoCAD", manufactured by Autodesk, Inc., San Rafael, United States of America.

BACKGROUND OF THE INVENTION

The complex data structures of such application programs typically contain a large number of various data items that are used for achieving the main functionality of the application program. For example, in the case of CAD programs each model contains data controlling the geometry of the parts, material specifications, attributes of the parts, global data and so on. All these data items are processed by the CAD program in a predetermined way to control the generation of graphical representations of the model, including various kinds of parts lists, bills of materials (BOMs) and so on. However, this processing is not very flexible since it is done by the program itself or by add-on components produced by associated suppliers that need to have a detailed knowledge about internals the program.

It would be desirable to provide a more flexible way of accessing and using the internal data processed by the application program. In particular, it should be possible for the end-user or for independent developers to access the data even if only a limited amount of knowledge about the internal data structures of the program is available. This, however, is not easy to accomplish because the data is typically stored in a complex way. The individual data items may be distributed across the model into various data objects, and the data objects may be interconnected in a complicated net structure. Even if some kind of data hierarchy is considered (e.g., assembly level, part level, feature level), it is still difficult to determine the appropriate hierarchy level for each data item.

Present text processing programs like those sold under the trademark Microsoft Word provide the possibility of accessing a predefined set of internal data items (like the title of a document or the current page number) under predefined names. This approach, however, is limited to relatively simple data structures appearing in the well-defined area of text processing.

OBJECTS AND SUMMARY OF THE INVENTION

An object of the present invention is therefore to avoid the problems mentioned above at least in part. A further object is to provide a way of accessing application data items that is very flexible and can in particular be used with complex application data structures comprising a plurality of interconnected data objects. Yet a further object of preferred embodiments of the invention is to enable data access without requiring deep knowledge about internals of the application program. A further object of preferred embodiments of the invention is that the data access is user-friendly such that it can be employed by typical end-users of the application program.

For solving at least some of the above-mentioned objects, the invention comprises a method for providing access to application data items of an application program, the application data items being contained in a plurality of interconnected data objects processed by the application program, the method comprising the steps of receiving a request related to at least one of the application data items, the request referring to a data object of the plurality of data objects, fulfilling the request with respect to the data object referred to by the request, and, if the request concerns at least one other data object of the plurality of data objects, forwarding the request to the at least one other data object for further processing of the request. The computer program product and the apparatus of the present invention comprise corresponding features. The dependent claims define preferred embodiments of the invention.

The invention is based on the idea of using requests related to at least one application data item without requiring that this application data item is stored in a data object that is referred to by the request. The request will be processed as far as possible with respect to the data object referred to by the request. Furthermore, the request will be forwarded to at least one other data object for further processing, if the request concerns such an other data object.

The invention offers the considerable advantage that the request may be directed to a data object that does not hold the requested data itself. If necessary, the interconnected object structure will be run through fully or in part during the processing of the request. In other words, requests concerning any data object or even all data objects can be made and will be processed even if only a single data object is referred to in the request. This makes is possible to access application data items contained in complex data structures even if just a bit of information about the whole data structure is known.

The claims contain the wording that the initial request "refers to" a data object of the plurality of data objects processed by the application program. This wording includes, but is not restricted to, the cases that the request contains a reference to this data object, that the request is directed to this data object, and that the request is directed to an object that has in turn some knowledge about the data object (in particular, such an object may be a data provider or an extension object of the data object). The request does not need to refer to only a single data object; it is instead possible in preferred embodiments of the invention that several data objects are referred to by the request.

The step of "fulfilling" the request with respect to one data object may include any processing or modification of or access to this data object, or it may just be the step of determining that the data object is not needed in the overall processing of the request, such that the request may be forwarded immediately to other data objects.

Generally the order of the steps recited in the claims should not be construed as a limitation of the scope of the present invention. The invention comprises all embodiments in which the recited method steps are performed in a different order or in a parallel or interleaved (quasi-parallel) fashion.

It is preferred that a request that has been forwarded from a first data object to a second data object is processed again at the second data object as described above. In the course of this processing, the request may again be forwarded to a third data object and so on, until the whole (or a part) of the data objects are run through in a recursive or iterative manner. Some bookkeeping is performed for ensuring termination of this process.

In preferred embodiments, the interconnection structure of the data objects is such that any two objects may be associated or not associated to one another. Preferably only associated objects are considered when forwarding any request. An associated object may be a super-object or a sub-object or a related object in some embodiments. The forwarding of a request may be limited with respect to sub-objects, but it will preferably cover all super-objects and all related objects that did not already receive the request.

Some embodiments of the invention provide the possibility that the request is a request for initialization of the access providing functionality. Such a request preferably causes the creation of a data provider for the object referred to by the request and for each other object to which the request will eventually be forwarded. Extension objects may be present in some embodiments for processing these initialization requests.

Another type of request that is provided in preferred embodiments is a request for obtaining a collection comprising the names of all application data items accessible via the data object referred to by the request. In other words, the names of the accessible data items are collected from:

the object referred to by the request, all objects immediately (i.e., by following exactly one association link) associated with this object, and all objects transitively (i.e., by following more than one association link) associated with this object.

The above-mentioned request type for gathering the names of accessible data items provides a user-friendly way of gathering information about the whole network of data objects. The names will normally be self-descriptive. Another request type that is implemented in some embodiments for assisting the user is a request for obtaining a collection of sample expressions. Such sample expressions may also provide valuable guidance for the user.

Further request types that will be present in most embodiments of the invention are requests to read and/or to set the value of an application data item.

Preferred embodiments of the invention further comprise an evaluator that provides a front-end for using the inventive data access functionality. The evaluator may, in particular, be adapted to evaluate expressions that contain references to application data items stored in the various data objects. The result of the evaluation may in turn be put into an application data item and possibly be displayed to the user. It is especially preferred that the evaluation process is repeated upon the occurrence of a recalculation event such that the results will automatically be adjusted to any changes in the data objects.

In preferred embodiments of the invention, the application program is used for the displaying and/or editing of documents. The application program may in particular be a CAD program. It is further preferred that the access functionality is provided not as the main function, but as an auxiliary function of the application program. In other words, preferred embodiments of the present invention are not intended for use in connection with databases and data access programs, but they are intended for use with text and grapic processing and editing programs.

Preferred embodiments of the computer program product and the apparatus of the present invention also comprise features corresponding to the features described above and/or to the features defined in the dependent method claims.

DETAILED DESCRIPTION OF SAMPLE EMBODIMENTS

Further features, objects and advantages of the invention will be apparent from the following detailed description of several sample embodiments thereof. Reference is made to the schematic drawings, in which.

Figure 1:
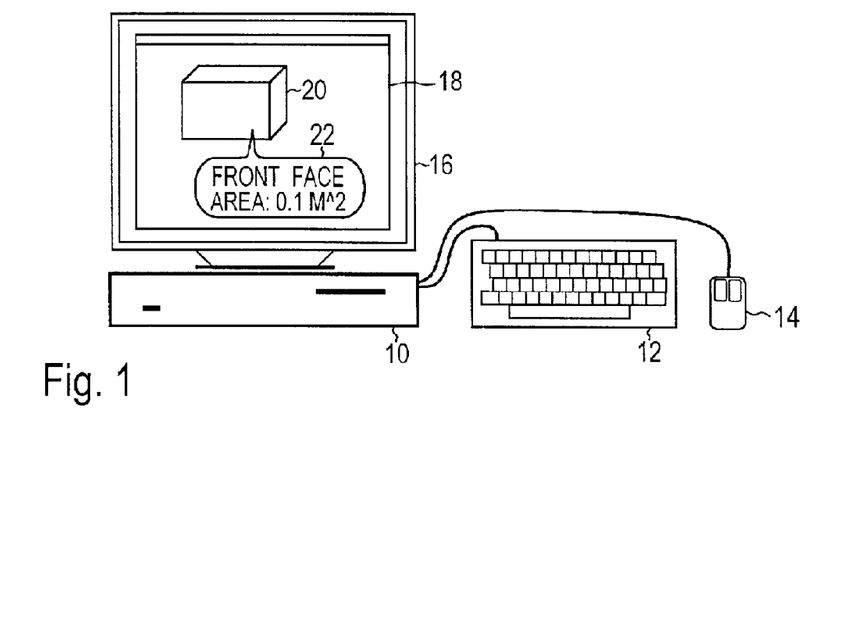
FIG. 1 shows a computer executing an application program in which the present invention is implemented.

The apparatus shown in FIG. 1 is a well-known personal computer or workstation comprising a main unit 10, a keyboard 12, a mouse 14 and a video display 16. The computer executes, as an application program, a CAD program based on the program sold under the trademark "AutoCAD", which has been extended to implement the functionality of the present invention. In a manner that is well-known per se, the CAD program performs a large variety of functions in connection with the displaying and editing of drawing and design documents. Each drawing and design document contains a plurality of drawing objects, and each of the drawing objects reflects a data object processed by the CAD program.

In the example of FIG. 1, a window 18 is shown on the video display 16 under control of the CAD program, and two drawing objects, namely a cuboid 20 and a balloon 22, are displayed in the window 18. The balloon 22 contains an annotation text concerning a property of the cuboid 20, namely the area of its front face. It has already been possible in prior versions of the "AutoCAD" CAD programs to enter an annotation text like that contained in the balloon 22 manually. However, in these program versions, there was no direct connection between the annotation text (in particular the numerical value mentioned therein) and the actual properties of the corresponding drawing object. One possible application of the invention is that the annotation text in the balloon 22 may now be generated and updated automatically since access is provided to internal data items of the data object corresponding to the cuboid 20.

Figure 2:
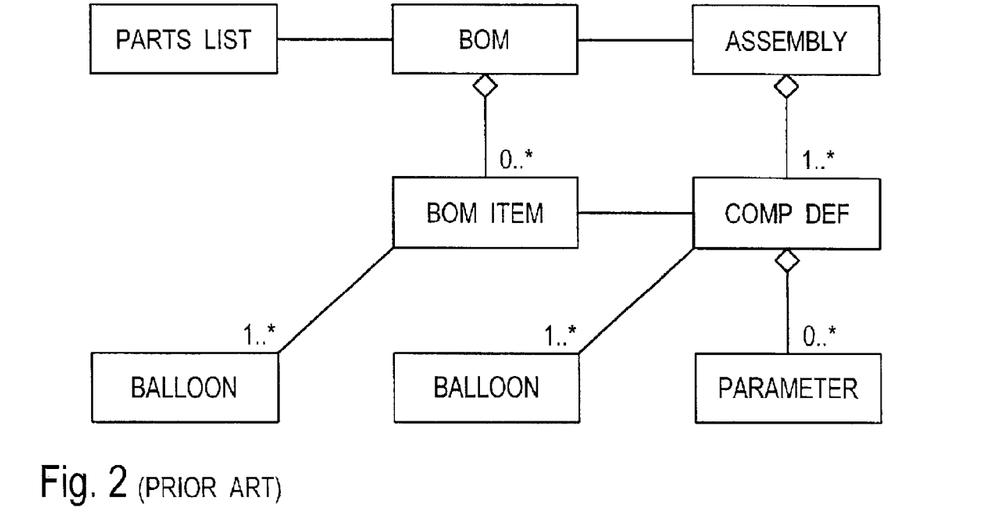
FIG. 2 shows a class diagram depicting an example of the interconnection structure of data objects processed by the application program.

The class diagram of FIG. 2 shows, as an example, the interconnected class structure of the data objects processed by the CAD application program. An object of the class "ASSEMBLY" is the owner of one or more objects of the class "COMP DEF" (component definition). This ownership relation is designated by the small box on the connection line between the classes "ASSEMBLY" and "COMP DEF" in FIG. 2. Correspondingly, each object of the class "COMP DEF" (or, for short, "COMP DEF" object) owns zero or more "PARAMETER" objects. In other words, the "ASSEMBLY" object is a super-object to each "COMP DEF" object, and each "PARAMETER" object is sub-object to the corresponding "COMP DEF" object.

Each "COMP DEF" object may have a related object in the class "BOM ITEM" (BOM=bill of materials). The super-object of all "BOM ITEM" objects is an object of the type "BOM", which is in turn related to the "ASSEMBLY" and the "PARTS LIST" objects. Each of the "BOM ITEM" and the "COMP DEF" objects may have one or more "BALLOON" objects related to it. For example, the cuboid 20 of FIG. 1 corresponds to a "COMP DEF" object processed by the CAD program, and the balloon 22 corresponds to a related "BALLOON" object.

Figure 3:
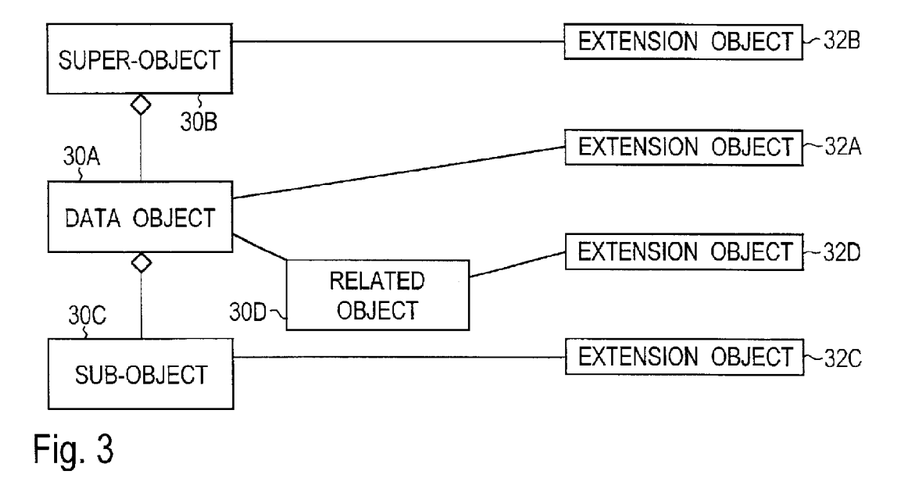
FIG. 3 represents an example of four data objects and their associated extension objects.

FIG. 3 depicts a possible object structure that may be present at one point of time during execution of the CAD program. A data object 30A has a super-object 30B, a sub-object 30C and a related object 30D. Exemplifying FIG. 3 by means of the structure of FIG. 2, the data object 30A may be an object of the class "COMP DEF", the super-object 30A may be an "ASSEMBLY" object, the sub-object 30C may be a "PARAMETER" object, and the related object 30D may be a "BALLOON" object. In the terminology used herein, two objects are "related" to each other if at least one of the objects contains a reference to the other one without being associated as owner and owned object. Two objects are "associated" with each other if they are either related to each other in the sense defined above, or if they are an owner and an owned object. In other words, an "associated object" is a super-object or a sub-object or a related object.

The different names for the objects 30A–30D have been chosen to describe the different roles of these objects in the particular example of FIG. 3. It is to be understood that all four objects 30A–30D are data objects processed by the CAD program, and that, for example, object 30C may in turn be a super-object of a further data object not shown in FIG. 3. Each of the objects 30A–30D comprises a plurality of application data items representing properties of the corresponding drawing or design objects. For example, if data object 30A is a "COMP DEF" object representing the cuboid 20 of FIG. 1, two application data items provided by this data object 30A could be the height and the width of its front face.

While the objects 30A–30D shown in FIG. 3 may also be present in a prior art CAD program, an important new feature of the present sample embodiment is that an extension object 32A–32D is provided for each of the data objects 30A–30D. The role of the extension objects is to implement various interfacing and bookkeeping functions for the data access features of the present sample embodiment.

An important service of the extension objects 32A–32D is that of creating the data providers proper. The corresponding process is shown in the flow diagram of FIG. 4. It is assumed that the extension object 32A of the data object 30A receives a request for initializing the data access functionality. This request, which only refers to the data object 30A (and not to any other associated objects), is processed by a method of extension object 32A. The first step 40 of this method is to create a data provider for the data object 30A (data provider 34A shown in FIG. 5). The role of the data provider is primarily to access the internal data of the associated data object. This will be explained in more detail below.

After the data provider 34A (FIG. 5) for the data object 30A has been created, the extension object 32A forwards the initialization request to the corresponding extension objects 32B–32D of all objects associated with the data object 30A. Block 42 in FIG. 4 covers this forwarding. First, in step 44, the initialization request is sent to all super-objects (more accurately, to the respective extension objects of the super-objects). In the present example, there is only one super-object 30B. The corresponding extension object 32B will, after receipt of the initialization request, start an execution sequence like that of FIG. 4 on its own, thereby creating a data provider 34B (FIG. 5) for the super-object 30B and recursively forwarding the initialization request to further associated objects.

Figure 4:
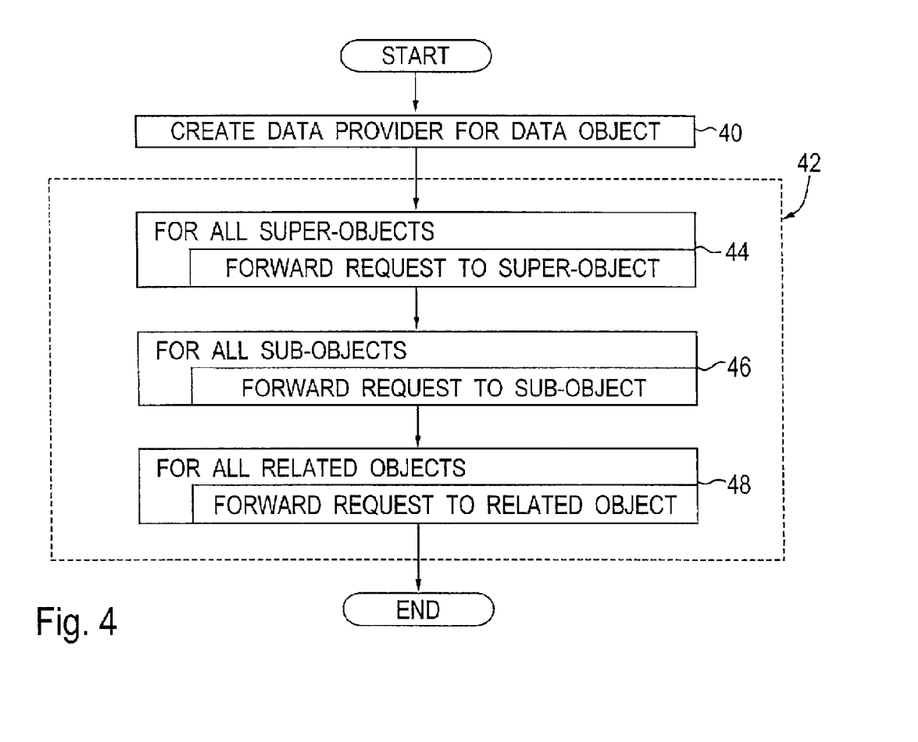
FIG. 4 is a flow diagram of the processing of an initialization request.

Similarly, the initialization request is sent to the extension object 32C of sub-object 30C in step 46, and it is forwarded to extension object 32D of the related object 30D in step 48. It is apparent that the exact order in which steps 44 to 48 are performed can be varied in alternative embodiments. It is, however, necessary to perform some kind of bookkeeping in order to ensure that only proper data providers are created in this process.

Figure 5:
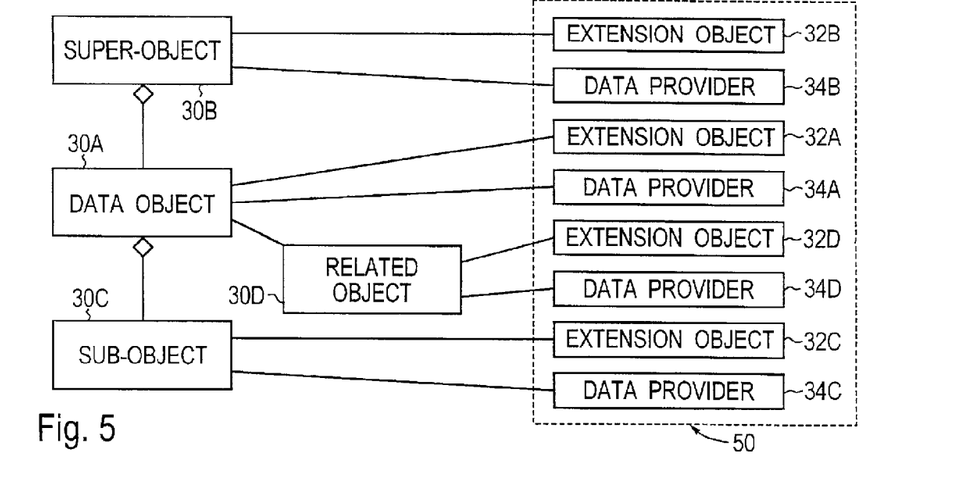
FIG. 5 shows the objects of FIG. 3 after the initialization has been performed.

The result of the initialization process is depicted in FIG. 5. As mentioned above, a data provider 34A–34D has been created for each of the data objects 30A–30D. The definitions of the extension objects 32A–32D and the data provider objects 34A–34D together form a computer program product 50 which can be used to extend the functionality of prior art CAD programs to cover the new data access features.

It is to be understood that each implementation of a data provider will normally only be suitable for one type of data objects (corresponding to one object type in a drawing). In other words, the data provider 34A–34D and the corresponding data object 30A–30D must be adapted to one another such that the data provider 34A–34D may perform the desired data access functionality. On the other hand, because the data objects 30A–30D and the data provider objects 34A–34D are independent entities, the data providers 34A–34D may be produced by external developers, and the data objects 30A–30D may be independently developed and changed. No "knowledge" of the data objects 30A–30D about the data providers 34A–34D is necessary.

In the present sample embodiment, there is no limitation with respect to the maximum depth up to which links to associated objects are followed during initialization of the data providers. In alternative embodiments, however, such limitations are contemplated. While it will normally be desirable to cover all (immediate and transitively associated) super-objects and all (immediate and transitively associated) related objects of a given data object, it may be advisable to follow links to sub-objects only to a limited extent. For example, a single component as the data object may comprise a plurality of holes machined into it. While it may be useful to initialize the data providers for each of the holes (for example, to obtain volume information for providing a more accurate calculation of the weight of the component), it may not be desirable to gather any data about sub-objects of the holes, such that the initialization routine may be terminated when reaching this level.

Figure 6:
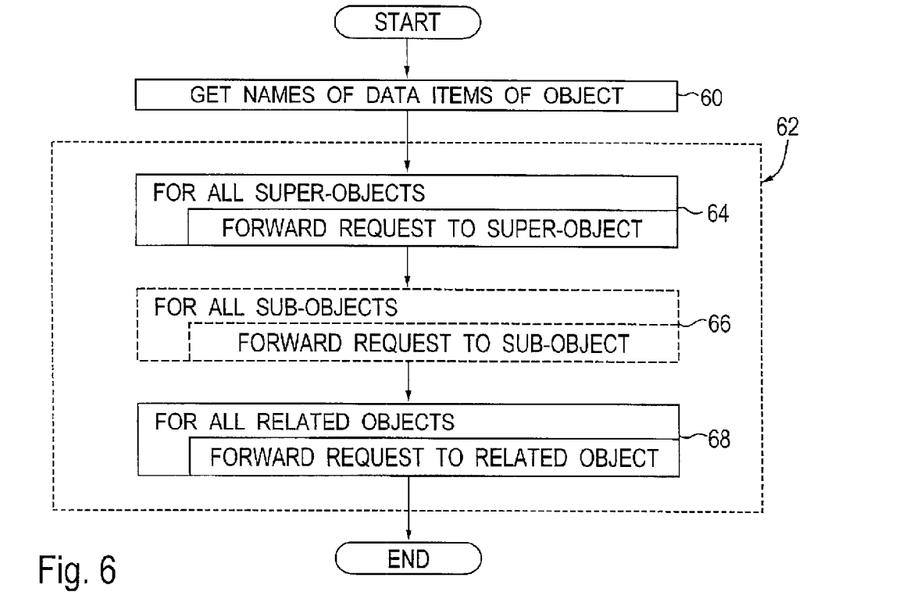
FIG. 6 is a flow diagram of the processing of a request for obtaining the names of accessible application data items.

The flow diagram of FIG. 6 represents the processing of a request for obtaining a list of the names of all data items accessible via the object 30A. The structure of this method is very similar to that of FIG. 4. In the present case, however, the request is sent to the data provider 34A of the data object 30A. The data provider 34A outputs the names of the data items held by the data object 30A in step 60. This is possible because the data provider 34A is specifically tailored to the type of the data object 30A and thus knows which data items are made available ("exposed") by this data object 30A.

A search is then made in the steps of block 62 for further names of application data items that are made available by other data objects associated to the data object 30A. Again, the search starts by querying the data providers of all super-objects in step 64 (in the present example, the query is made only to the single data provider 34B of super-object 30B). Any data provider that receives the forwarded request will in turn commence execution of the method of FIG. 6, and any names of data items will be added to the list. The process continues in step 66 with the querying of data providers of applicable sub-objects (data provider 34C of sub-object 30C in the present example). Finally the request is forwarded to the data providers of all related objects (data provider 34D of related object 30D in the present example).

Step 66 has been shown in dashed lines in FIG. 6 because the gathering of names from data providers of sub-objects will usually be truncated at some level in order to prevent name conflicts. Continuing the example given above where a single component comprised several holes represented by sub-objects, each of these holes may have a application data item called "diameter". It would raise difficult naming conflicts to distinguish between these variables. Therefore, in the present sample embodiment, none of the "diameter" data items is added to the list. Some schema is implemented in alternative embodiments for resolving such naming conflicts, such that more data item names can be gathered in response to the request.

Returning shortly to FIG. 2, consider the example that a request for gathering the names of available application data items is directed to the data provider of the "BALLOON" object related to the "BOM ITEM" object. The "BALLOON" object itself does not make any internal data available, but it passes the request to the data provider of the related "BOM ITEM" object. This data provider exposes variable names "ITEM" and "QTY" and forwards the request to the data providers of the "BOM" super-object and the related "COMP DEF" object. The data provider of the "BOM" object exposes, for example, the mass of all items in the BOM under the name "BOM:MASS". The data provider of the "COMP DEF" object exposes the mass of this component under the name "PART:MASS" and other attributes, for example "MATERIAL", and further passes the request to the data providers of any "PARAMETER" sub-objects and of the "ASSEMBLY" super-object. The data provider of each "PARAMETER" object exposes the parameter value with its name and adds it to the list. The data provider for the "ASSEMBLY" object finally adds global variables, for example, the name "GLOBHEIGHT".

All in all, the following list of available variable names is produced as the reply to the request: "ITEM, QTY, BOM:MASS, PART:MASS, MATERIAL, PART:LENGTH, GLOBHEIGHT". It is apparent that this list represents a large amount of information about the application data items concerned. Using the method of the present sample embodiment, it was possible to obtain this information on the basis of a reference to a single data object, namely the "BALLOON" object. No information about the internal structure of the application data was required.

Apart from the service of obtaining the names of all accessible application data items, the data providers 34A–34D also serve to implement various data access and data manipulation services. For example, the value of an application data item of the data object 30A or any associated object 30B–30D may be accessed.

Figure 7:
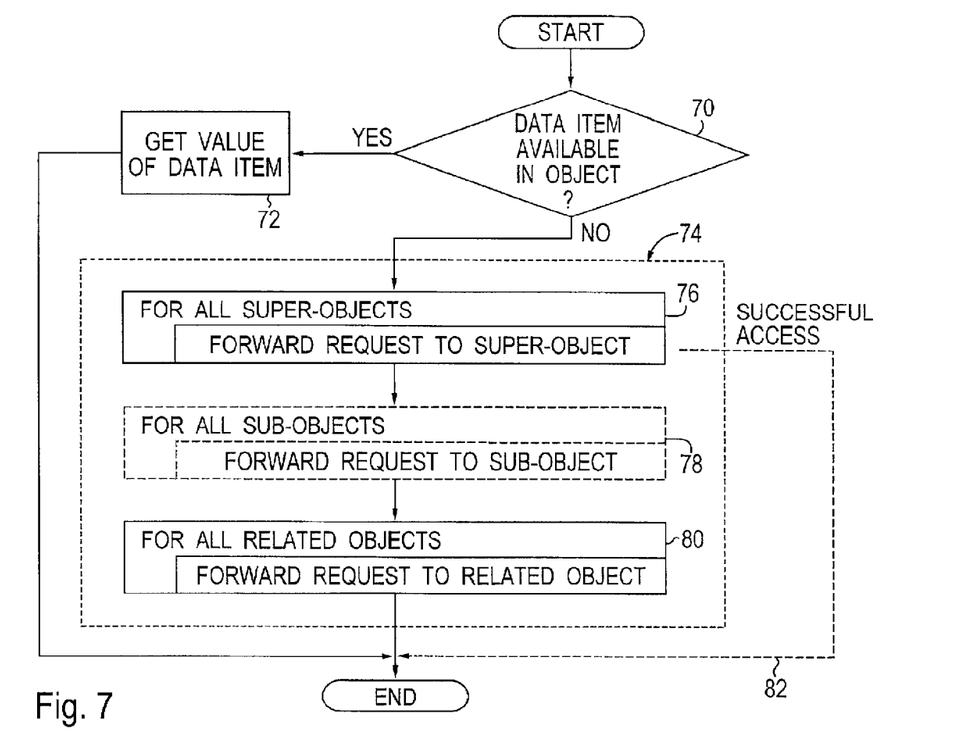
FIG. 7 is a flow diagram of the processing of a request for accessing the value of an accessible data item.

A first sample embodiment for a method for processing such an request for data access is shown in FIG. 7. When the data provider 34A of the data object 30A receives the request, a check is made in test 70 whether or not the data object 30A holds a data item having the name that is given in the request. If such a data item is available ("YES" branch of test 70), its value is obtained in step 72 and the method ends. If the data object 30A does not contain a appropriately named data item, the request is forwarded to all associated objects in block 74. This includes, in the presently described sample embodiment, forwarding the request to the data providers of all super-objects (step 76), to the data providers of all sub-objects (step 78), and to the data providers of all related objects (step 80). The data providers of the objects to which the request is forwarded again start execution of the method of FIG. 7.

It is apparent that this first embodiment of the data access functionality according to the method of FIG. 7 may consume unnecessarily high amounts of computing time for large networks of interconnected data objects. Therefore several alternative embodiments are contemplated in which the data access request will be forwarded in a more selective way. In a second embodiment, each object receiving a forwarded data access request returns some indication whether or not the request could be fulfilled successfully. This makes it possible to terminate the execution of block 74 as soon as the first successful data access is reported by an associated object. This optional possibility of an early termination of block 74 is indicated by the dashed arrow 82 in FIG. 7. In other alternative embodiments, the data provider of each data object maintains some information about the names of the data items available from other associated data objects. In this case, a data access request can be forwarded to the competent data provider in a more direct way than indicated in FIG. 7.

Again, it is to be noted that the data access functionality can be used to obtain access to a large number of application data items processed by the application program even if the internal organization of the data items and in particular the interconnection structure between the data objects is not known. It is sufficient to provide a reference to a single data object 30A with the request.

Another important functionality provided by the data provider object is that of setting or changing individual data items. Processing of such a data setting request also has the structure shown in FIG. 7, of course with the modification that step 72 is a step of writing the data item. Also the same alternative embodiments as described above in connection with FIG. 7 are possible.

Other functions implemented by the data providers 34A–34D include a test whether or not a data item having a specified name exists in the data object of a data provider or in an associated object, the test whether or not a data item is changeable, and the test whether or not new data items may be added to a data object.

The extension objects 32A–32D and the data providers 34A–34D are relatively low-level routines for accessing the internal application data of the CAD program. While these routines may be used by third party developers and also by the end user for programming extensions to the CAD program, a preferred embodiment of the computer software product (reference numeral 50 in FIG. 5) further includes an evaluator for providing the inventive functionality in a more user-friendly way. The evaluator can be used to evaluate textual expressions containing names of data items (enclosed in pointed brackets), simple mathematical operators (e.g. "+", "−", "*", "/") and arbitrary text for explanation purposes. Sample expressions that may be processed by the evaluator are, for example:

"Drawing title: <SI:TITLE>"
"=<ST:TITLE>: The title of the current drawing"
or, more generally:
"=free_text_1<expression1>free_text_2<expression2>...".

For providing improved user assistance, the evaluator also offers the functionality of proposing default expressions for each data object. Such default expressions are expressions that are normally considered useful in connection with a particular data object. Even if the user does not need any of the default expressions directly, they still serve as templates for assisting the user in formulating his or her own expressions, and they also contain all or at least some of the names of the data items available.

Any request for obtaining sample expression strings received by the evaluator is forwarded to the extension object of a data object for which the evaluator has been created. This extension object will then perform a method similar to that shown in FIG. 6, i.e., it will output its own sample expression string or strings, and it will forward the request to the extension objects of the other associated objects. However, in contrast to the method of FIG. 6, the request is handled by the extension objects 32A–32D (and not by the data provider objects 34A–34D) since the extension objects 32A–32D are more suitable for collecting and combining data item names coming from a variety of different data objects into single sample expressions.

Figure 8:
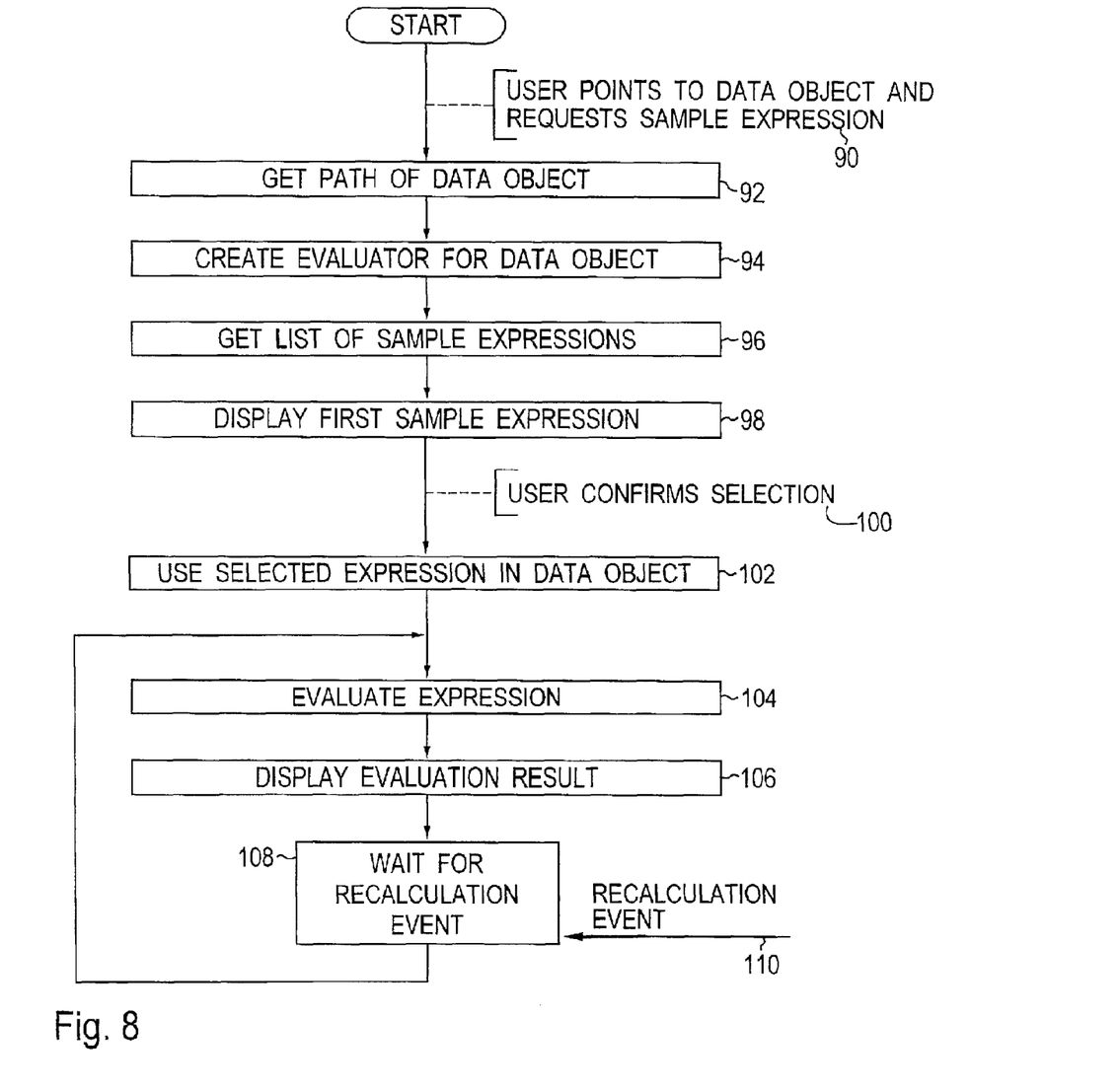
FIG. 8 is a flow diagram depicting a user-controlled evaluation procedure.

A possible execution sequence of a method according to a sample embodiment of the invention using the evaluator is shown in FIG. 8. The sample run is initiated by the user pointing to a data object and requesting a sample expression for this object (user action 90). For example, and having regard to FIG. 1, the user may point to the balloon 22 shown on the video display 16 using the mouse 14, and may request possible sample expressions via a context menu.

Figure 9:
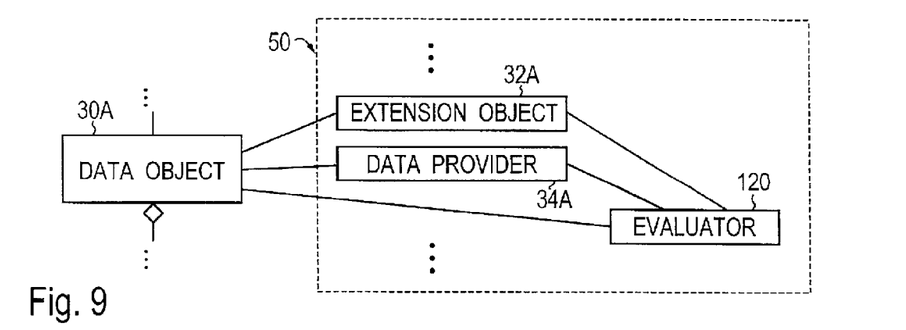
FIG. 9 is a portion of the object structure of FIG. 5 after creation of an evaluator.

In response to the pointing action of the user, the path of the data object pointed to will be determined in step 92. This path, which is the full hierarchically structured identifier of the data object, will be used to create an evaluator for the data object and to initialize it with the corresponding data provider and extension object. FIG. 9 shows, as an example, such an evaluator 120 that has been created for providing data access to the data object 30A (corresponding, in the present example, to the balloon 22), and that has been initialized with respect to the extension object 32A and the data provider 34A. The definition of the evaluator 120 is also part of the computer program product 50 of the presently described sample embodiment.

Returning to the flow diagram of FIG. 8, the evaluator now obtains the list of sample expressions (step 96) from the extension object 32A of the data object 30A. The processing steps performed in this connection have already been described above in a general way. In the present example, and having regard to FIG. 1, balloon 22 (for which the evaluator has been initialized) does not offer a sample expression, but it forwards the request to the extension object of the associated data object representing the cuboid 20. The first sample expression returned in connection with the cuboid 20 may be the expression "front face area: <HEIGHT*WIDTH>m^2", which yields the area of the visible front face of the cuboid 20. This first sample expression is displayed in step 98, and the user is offered the possibility of scrolling through other possible sample expressions.

When the user confirms selection of a sample expression in user action 100, the selected expression is used in the data object referenced by the user. In the present case, this expression will be incorporated into the data object representing the balloon 22. The expression is now evaluated in step 104, and the evaluation result is displayed to the user as the contents of the balloon 22 (step 106).

The result shown in the balloon 22 remains unchanged as long as the values of the data items used in the corresponding expression do not change (waiting state 108). Whenever such a change has or may have taken place, a recalculation event 110 is triggered automatically. In addition, recalculation of all expressions is also performed upon a manual request of the user or when the whole drawing is re-displayed. Steps 104 and 106 are repeated in the course of the recalculation. This ensures that the expression values displayed in the drawing are always correct and automatically reflect any modification or change of the drawing objects.

The expression evaluating capability of the present sample embodiment has been described above for the example of an expression contained in the balloon 22. It is, however, apparent that expressions can be used equally well in a variety of other drawing objects, most notably in "BOM" and "BOM ITEM" objects as well as in "PARTS LIST" and "NOTE" objects. As a further example, the title block of a drawing could use data items of the associated "BOM" object to display the default scale or to display information like, for example, the total mass, the name of the BOM, the standard being used to produce the drawing. It is further easily possible to create parametric "NOTE" objects for any drawing object, and intelligent chamfer and fillet annotation (always displaying the proper sizes) is possible. The data obtained from drawing objects may also be exported into a calculation sheet, and the surface texture may display the actual attribute being assigned to the surface, if such an attribute exists.

In further alternative embodiments, the evaluator not only processes dimensionless numbers but also units. Functions are provided for calculating the resulting units from an expression, for converting values with different basic units (e.g., millimeters and inches) into one another, and for correctly performing calculations with different secondary units (e.g., millimeters, meters, kilometers).

It is apparent that the application possibilities and alternative embodiments described above represent just some examples, and that a wide range of further applications of the teachings of the present invention exist both in the context of CAD programs and with respect to other application programs. The details given above thus should not be construed as limitations of the scope of the invention, but rather as exemplifications of preferred embodiments thereof. Accordingly, the scope of the present invention should be determined not by the embodiments illustrated, but by the appended claims and their legal equivalents.

We claim:

1. A computer-implemented method for providing access to application data items of an application program, the application data items being contained in a plurality of interconnected data objects processed by said application program, said method comprising the steps of:
   an extension object, that is associated with one of the plurality of data objects, receiving a request related to at least one of said application data items, said request referring to the associated data object of said plurality of data objects,
   said extension object fulfilling said request with respect to said data object referred to by said request by creating a data provider object that is configured with functionality to provide access to an expose internal data of the associated data object, and if said request concerns at least one other data object of said plurality of data objects, said extension object forwarding said request to one or more additional extension objects that are each associated with other data objects for further processing of said request.

2. The method of claim 1,
wherein said further processing of said request by another data object to which said request has been forwarded includes the steps of:
fulfilling said request with respect to said other data object to which said request has been forwarded, and
if said request concerns at least one further data object, forwarding said request to said at least one further data object for further processing of said request.

3. The method of claim 1,
wherein said data objects are interconnected in a way that, for each data object, zero or more data objects are associated thereto, and wherein each request is considered as concerning at least some of the data objects associated to said data object referred to by said request.

4. The method of claim 3,
wherein said request is a request selected from the group comprising a request for obtaining a collection comprising the names of all application data items accessible via said data object referred to by said request and a request for obtaining a collection of sample expressions, said sample expressions comprising at least some of the names of the application data items accessible via said data object referred to by said request.

5. The method of claim 4,
wherein said application data items accessible via said data object referred to by said request include the application data items contained in said data object referred to by said request and the application data items contained in any of the data objects associated thereto.

6. The method of claim 3,
wherein said request is a request for obtaining the value of an application data item contained in said data object referred to by said request or in any of the data objects associated thereto.

7. The method of claim 6,
further comprising the steps of:
creating an evaluator for a data object,
calling said evaluator with an expression comprising at least one name of an application data item contained in said data object or in any of the data objects associated thereto,
evaluating said expression using obtained nines of said application data items whose names are comprised in said expression, and
outputting the result of said evaluation.

8. The method of claim 7,
wherein said steps of evaluating said expression and of outputting said result are repeated upon the occurrence of a recalculation event.

9. The method of claim 8,
wherein said result of said evaluation is output as an application data item of one of said data objects processed by said application program.

10. The method of claim 1,
wherein said data objects are interconnected in a way that, for each data object, zero or more data objects are associated thereto as super-objects, and zero or more data objects are associated thereto as sub-objects, and zero or more data objects are associated thereto as related objects, and wherein each request is considered as concerning at least those data objects that are associated to said data object referred to by said request as super-objects and at least those data objects that are associated to said data object referred to by said request as related objects.

11. The method of claim 10,
wherein each request is additionally considered as concerning at least those data objects that are associated to said data object referred to by said request as sub-objects.

12. The method of claim 1,
wherein said request is a request for initialization of the access providing functionality.

13. The method of claim 1,
wherein the main functionality of said application program is a functionality selected from the group comprising the graphical displaying of documents reflecting said data objects and the textual displaying of documents reflecting said data objects and the graphical editing of documents reflecting said data objects and the textual editing of documents reflecting said data objects.

14. The method of claim 1,
wherein said application program is a CAD program, and said application data is the data processed by said CAD program.

15. The method of claim 1,
wherein said access is provided as an auxiliary function of said application program.

16. A computer program product for execution by a computer for providing access to application data items of an application program, the application data items being contained in a plurality of interconnected data objects processed by said application program, said computer program product comprising instructions for causing said computer to perform the steps of:
an extension object, that is associated with one of the plurality of data objects, receiving a request related to at least one of said application data items, said request referring to the associated data object of said plurality of data objects,
said extension object fulfilling said request with respect to said data object referred to by said request by creating a data provider object that is configured with functionality to provide access to expose internal data of the associated data object, and
if said request concerns at least one other data object of said plurality of data objects, said extension object forwarding said request to one or more additional extension objects that are each associated with other data objects for further processing of said request.

17. The computer program product of claim 16,
wherein said computer program product farther comprises instructions for causing said computer to perform, for said further processing of said request by another data object to which said request has been forwarded, the steps of:
fulfilling said request with respect to said other data object to which said request has been forwarded, and
if said request concerns at least one further data object, forwarding said request to said at least one further data object for further processing of said request.

18. The computer program product of claim 16,
wherein said application program is a CAD program, and said application data is the data processed by said CAD program.

19. An apparatus comprising at least one computer, said computer being programmed for providing access to application data items of an application program, said application data items being contained in a plurality of interconnected data objects processed by said application program, said computer being programmed for executing the steps of:

an extension object, that is associated with one of the plurality of data objects, receiving a request related to at least one of said application data items, said request referring to the associated data object of said plurality of data objects, said extension object fulfilling said request with respect to said data object referred to by said request by creating a data provider object that is configured with functionality to provide access to an expose internal data of the associated data object, and if said request concerns at least one other data object of said plurality of data objects, forwarding said request to one or more additional extension objects that are each associated with other data objects for further processing of said request.

* * * * *

UNITED STATES PATENT AND TRADEMARK OFFICE
CERTIFICATE OF CORRECTION

PATENT NO. : 6,918,121 B2
DATED : July 12, 2005
INVENTOR(S) : Stejskal et al.

It is certified that error appears in the above-identified patent and that said Letters Patent is hereby corrected as shown below:

Column 10,
Line 66, "an" should read -- and --.

Column 11,
Line 52, "nines" should read -- values --.

Column 12,
Line 57, "farther" should read -- further --.

Signed and Sealed this

Thirteenth Day of September, 2005

JON W. DUDAS
*Director of the United States Patent and Trademark Office*